US012575294B2

(12) United States Patent
Oh et al.

(10) Patent No.: US 12,575,294 B2
(45) Date of Patent: Mar. 10, 2026

(54) SWITCHABLE TRANSPARENT ORGANIC LIGHT-EMITTING DIODE DISPLAYS WITH AN INTEGRATED ELECTRONIC INK LAYER

(71) Applicant: Dell Products L.P., Round Rock, TX (US)

(72) Inventors: Guen Taek Oh, Singapore (SG); BongJun Lee, Singapore (SG)

(73) Assignee: Dell Products L.P., Round Rock, TX (US)

( * ) Notice: Subject to any disclaimer, the term of this patent is extended or adjusted under 35 U.S.C. 154(b) by 782 days.

(21) Appl. No.: 17/684,821

(22) Filed: Mar. 2, 2022

(65) Prior Publication Data

US 2023/0284506 A1    Sep. 7, 2023

(51) Int. Cl.
| | |
|---|---|
| *H10K 59/50* | (2023.01) |
| *G02F 1/167* | (2019.01) |
| *G02F 1/16757* | (2019.01) |
| *G02F 1/1685* | (2019.01) |
| *H10K 59/35* | (2023.01) |
| *H10K 102/00* | (2023.01) |

(52) U.S. Cl.
CPC ............. *H10K 59/50* (2023.02); *G02F 1/167* (2013.01); *G02F 1/16757* (2019.01); *G02F 1/1685* (2019.01); *H10K 59/35* (2023.02); *H10K 2102/3031* (2023.02)

(58) Field of Classification Search
CPC .................. H10K 59/50; H10K 59/35; H10K 2102/3031; G02F 1/167; G02F 1/16757; G02F 1/1685; G02F 1/1679
See application file for complete search history.

(56) References Cited

U.S. PATENT DOCUMENTS

| | | | |
|---|---|---|---|
| 8,144,463 B2 | 3/2012 | Doglio et al. | |
| 10,816,851 B2 | 10/2020 | Kim et al. | |
| 10,928,575 B2 | 2/2021 | Oh et al. | |
| 11,067,809 B1 * | 7/2021 | Sears ................. | G02F 1/13475 |
| 2015/0153626 A1 * | 6/2015 | Cai ........................ | G02F 1/167 |
| | | | 359/296 |
| 2018/0293931 A1 * | 10/2018 | Ades ..................... | G06F 1/1616 |
| 2020/0335036 A1 * | 10/2020 | Hrehor, Jr. .......... | G09G 3/2003 |
| 2020/0387035 A1 | 12/2020 | Oh et al. | |
| 2021/0003886 A1 | 1/2021 | Kang et al. | |

* cited by examiner

*Primary Examiner* — Michael E Teitelbaum
(74) *Attorney, Agent, or Firm* — Larson Newman, LLP

(57) ABSTRACT

An information handling system includes a transparent organic light-emitting diode (OLED) display panel and an electronic ink layer integrated with the OLED display panel. In response to a determination that a signal is to turn off a transparency feature of the transparent OLED display panel, an OLED display controller may apply a positive electric field to the electronic ink layer. In response to the application of the positive electric field to the electronic ink layer, microcapsules may be dispersed to fill clear sections of pixels of the transparent OLED display panel.

20 Claims, 4 Drawing Sheets

100

Information Handling System

| | | | |
|---|---|---|---|
| 102 Processor | 104 Processor | | 134 Video Display |

120 Memory — 122 — 110 106 Chipset — 132 — 130 136 Graphics Interface

112

140 NVRAM
142 BIOS/ EFI

192

170 I/O Interface

150 Disk Controller

176 TPM

180 Network Interface

174 Add-On Resource 172

156 ODD — 152

154 HDD

190 BMC — 194

182

160 Disk Emulator

164 — 162 Solid State Drive

OLED display Controller 240

400

SWITCHABLE TRANSPARENT ORGANIC LIGHT-EMITTING DIODE DISPLAYS WITH AN INTEGRATED ELECTRONIC INK LAYER

FIELD OF THE DISCLOSURE

The present disclosure generally relates to information handling systems, and more particularly relates to switchable transparent organic light-emitting diode displays with an integrated electronic ink layer.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a transparent organic light-emitting diode (OLED) display panel and an electronic ink layer integrated with the OLED display panel. In response to a determination that a signal is to turn off a transparency feature of the transparent OLED display panel, an OLED display controller may apply a positive electric field to the electronic ink layer. In response to the application of the positive electric field to the electronic ink layer, microcapsules may be dispersed to fill clear sections of pixels of the transparent OLED display panel.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM)

devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four-lane (x4) PCIe adapter, an eight-lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out-of-band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

Information handling systems generally present outputs as visual images at a display device, such as video display 134, which may be a liquid crystal display (LCD) or an organic light-emitting diode (OLED) display device. OLED display devices can be transparent display devices. However, with higher transparency comes lower readability as current transparent OLED displays have design limitations in displaying black levels in a bright environment. Generally the darker the black level, the better the quality of the visuals. As such, there is a tradeoff between front-of-screen (FOS) optical performance and transparency of the OLED display devices. This tradeoff limits the usage of OLED display devices in some environments such as using an OLED display as a display monitor for an information handling system. Thus, there is a need to improve the FOS performance and user experience of the OLED display devices to gain wider consumer and enterprise adaptation of the transparent OLED display devices.

Figure 2:
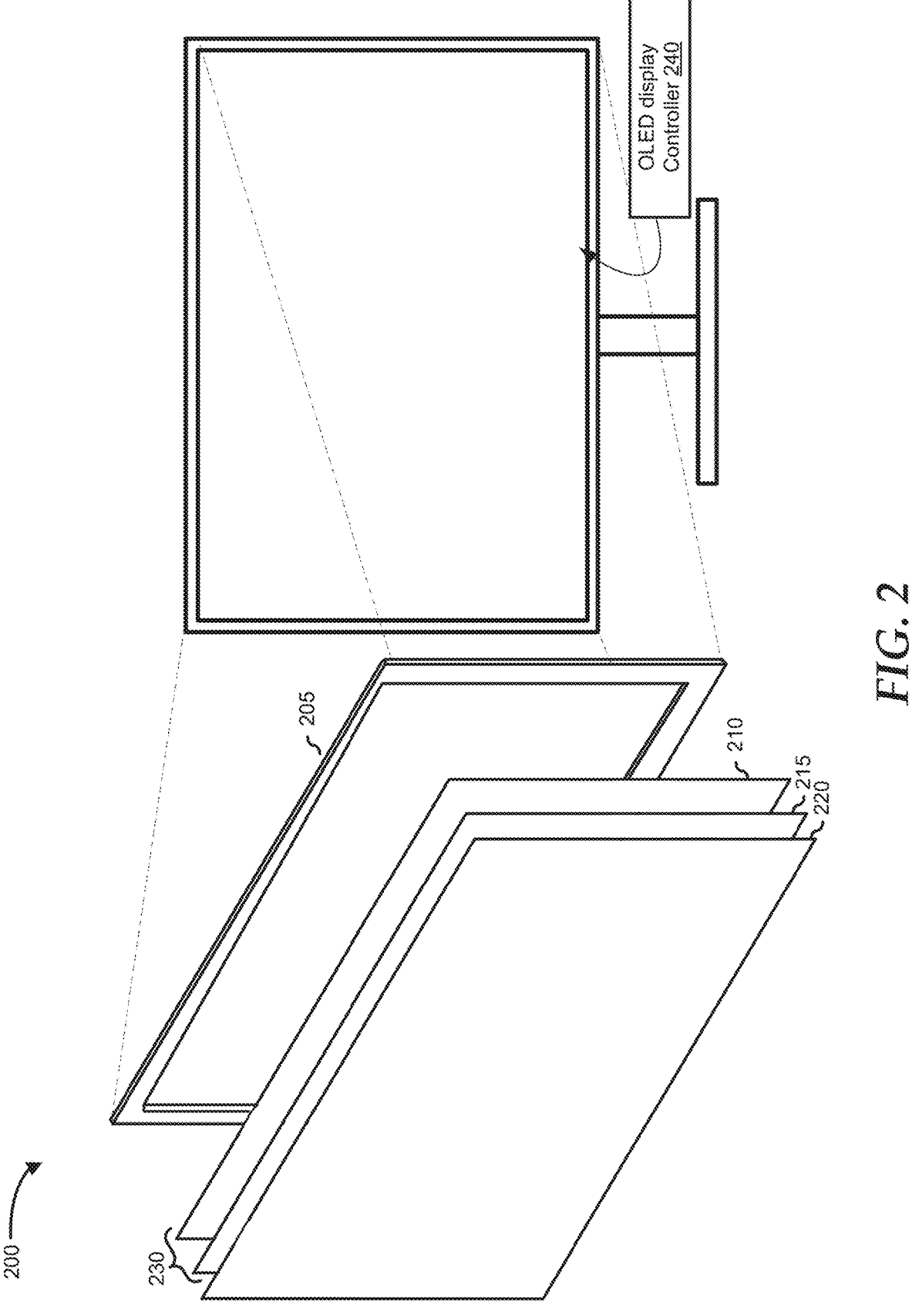
FIG. 2 is a block diagram illustrating an example of a switchable transparent organic light-emitting diode (OLED) display with an integrated electronic ink layer, according to an embodiment of the present disclosure.

FIG. 2 shows a display 200 of an information handling system such as information handling system 100 of FIG. 1 that includes a switchable transparent OLED display with the integrated electronic ink layer. Display 200, which is similar to video display 134 of FIG. 1, includes a frame 205, a transparent OLED display panel 220, an electronic ink layer 230, and an OLED display controller 240. Frame 205 holds transparent OLED display panel 220 and electronic ink layer 230. Frame 205 may also hold an additional panel or layer such as a glass panel. OLED display controller 240 may be part of a circuit board that typically sits below the glass panel of display devices. In one example, OLED display controller 240 may be part of a timing controller of display 200.

Display 200 may include other components not shown for simplicity. For example, display 200 may include a glass or film on at least one side of transparent OLED display panel 220. The components of display 200 may be implemented in hardware, software, firmware, or any combination thereof. In addition, the components shown are not drawn to scale, and display 200 may include additional or fewer components. For example, in certain embodiments, all or a portion of the functionality provided by the illustrated components may instead be provided by components integrated into one or more processor(s) as a system-on-a-chip. In addition, connections between components may be omitted for descriptive clarity.

In one embodiment, the present disclosure integrates an electrophoretic ink layer with transparent OLED display panel 220, providing the capability of switching the transparency feature of transparent OLED display panel 220 on and off. The transparency feature of transparent OLED display panel 220 can be turned on when the transparent effect of the OLED display device is needed or desired. For example, transparent OLED displays can be used for interactive play, signage, or other commercial applications. Accordingly, the transparency feature of transparent OLED display panel 220 can be turned off when the transparent effect of the OLED display device is needed or desired. For example, the transparency feature of transparent OLED display panel 220 can be turned off when a user is working in an office, watching a movie, at a conference call, etc.

Electronic ink layer 230 which is transparent may be integrated with transparent OLED display panel 220. Electronic ink layer 230 may include a conductive oxide panel that is disposed on one side of transparent OLED display panel 220. In one embodiment, electronic ink layer 230 includes a top transparent electrode conductive substrate 215 and a bottom transparent conductive substrate 210 which may be made of indium tin oxide (ITO) substrate. In other embodiments, other conductive oxide substrates may be used for top transparent electrode conductive substrate 215, and bottom transparent conductive substrate 210, such as indium gallium tin oxide, indium zinc oxide, tin oxide, zinc oxide, or similar. Sandwiched between top transparent electrode conductive substrate 215 and bottom transparent conductive substrate 210 is a film with electronic ink microcapsules.

OLED display controller 240 may be configured to control the signal that allows transparent OLED display panel 220 to switch or transition between the appearance of opaque and transparent states. In one embodiment, OLED display controller 240 may supply a voltage/electrode signal or another form of the control signal that can apply an electric field across the electronic ink microcapsules. The signal may apply an electric field by forming a transparent electrode above and below the electronic ink. For example, a positive or negative electric field may be applied to the integrated electronic ink in particular to top transparent electrode conductive substrate 215 and/or bottom transparent conductive substrate 210. Typically, a negative electric field is applied to bottom transparent conductive substrate 210. When a positive electric field is applied to top transparent electrode conductive substrate 215, transparent OLED display panel 220 may transition to appear opaque. When a negative electric field is applied to top transparent electrode conductive substrate 215, transparent OLED display panel 220 may transition to have the transparent effect.

Although the exemplary embodiment of present disclosure shows display 200 which is a display monitor typical of a desktop information handling system, the present disclosure may be used in other embodiments, such as television screens, an instrument display, a portable information handling system such as smartphones, laptops, notebooks, notepads, and handheld game consoles.

Figure 3:
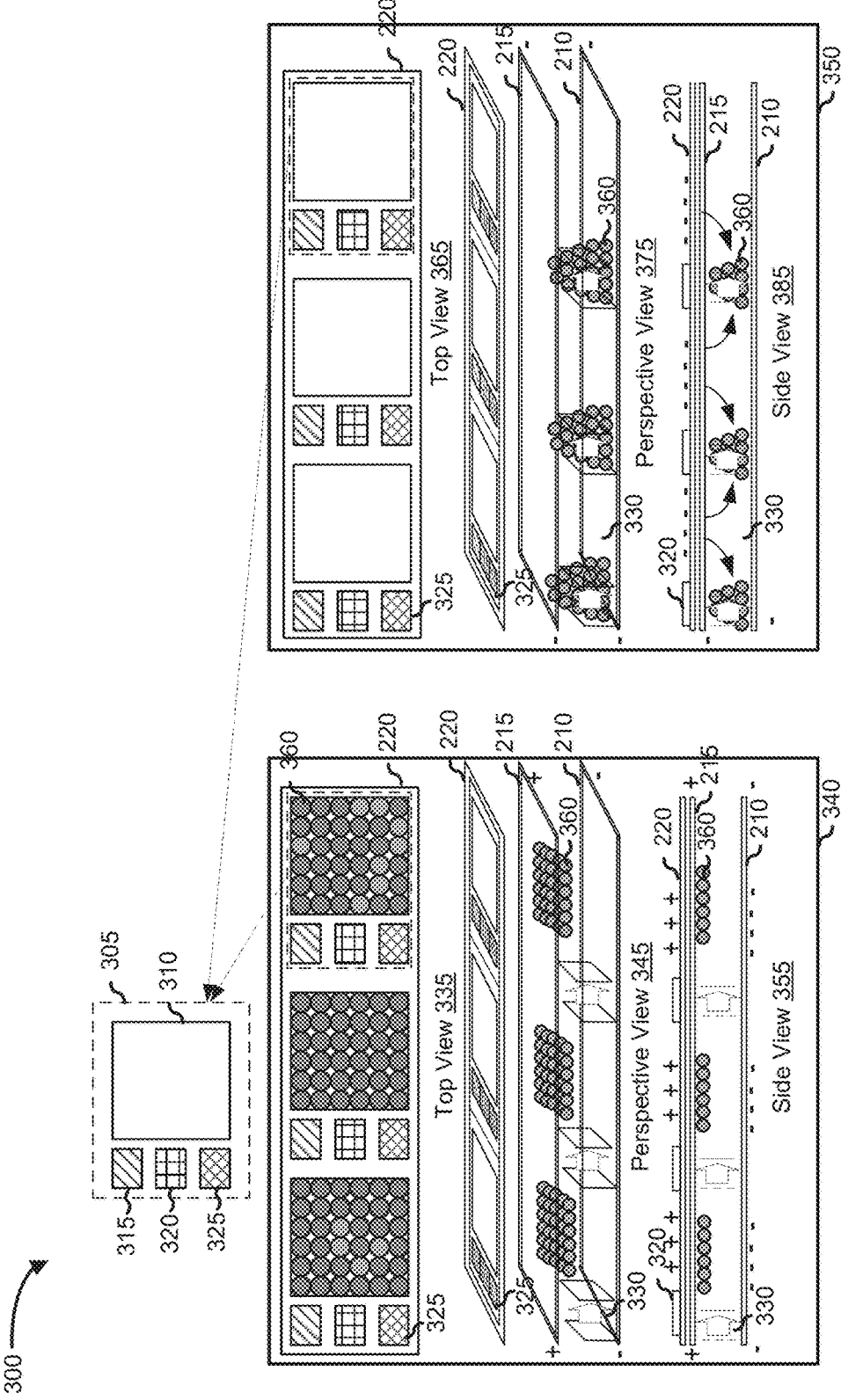
FIG. 3 is a flowchart illustrating different views of a switchable OLED display with the integrated electronic ink layer, according to an embodiment of the present disclosure.

FIG. 3 shows a diagram 300 with different views of several components of display 200. Diagram 300 includes a multiview diagram 340 and a multiview diagram 350. Multiview diagram 340 includes different views, such as a top view 335, a perspective view 345, and a side view 355 of the components associated with display 200 during an opaque state of display 200. Multiview diagram 350 includes different views, such as a top view 365, a perspective view 375, and a side view 385, of the components associated with display 200 during a transparent state of display 200.

Transparent OLED display panel 220 includes pixels that when energized emit light according to the color specified for the particular pixel. In an embodiment, each pixel, such as pixel 305 in transparent OLED display panel 220 includes a red sub-pixel 325, a green sub-pixel 320, a blue sub-pixel 315, and a clear section 310. Color is created by the combination of the red, green, and blue sub-pixels with clear section 310. The area occupied by the combination of the red, green, and blue sub-pixels is herein referred to as a display area. The clear section, such as clear section 310, creates the transparency effect. This clear section is also referred to herein as a transparent area.

Sandwiched between the top transparent electrode conductive substrate 215 and bottom transparent conductive substrate 210 is a microencapsulated electrophoretic material, also referred to as electronic ink, suspended in sealant also referred to as a rib. The electronic ink includes millions of microcapsules, such as microcapsules 360, containing charged pigment particles. In one embodiment, the charged pigment particles may be negatively charged single pigment particles in a black or similar dark pigment. The sealant such as a sealant 330 may be made of photoresist polymer, wherein it may be white, clear, or any particular color.

Top view 335 shows how transparent OLED display panel 220 appears when viewed with the electronic ink microcapsules are dispersed to cover or fill the area below the clear sections of the pixels of transparent OLED display panel 220. Because of the black pigments in the microcapsules, the clear section may appear opaque to a user. To move or disperse the microcapsules to cover the clear sections, thin electrodes may be added above and below switching electronic ink layer 230 and a positive electric field or charge may be applied to top transparent electrode conductive substrate 215 or sections thereof. The positive charge may attract the negatively charged black pigments of the microcapsules which then fill or cover the clear sections controlling the light passing through transparent OLED display panel 220. Perspective view 345 and side view 355 further shows diagonal and side views respectively of how the microcapsules block the light from passing through the clear sections of the pixels. In addition, perspective view 345 and side view 355 shows how the sealant occupies the space in the electronic ink layer 230 that is below the display area of each pixel.

Top view 365 shows how transparent OLED display panel 220 appears when viewed with the electronic ink microcapsules are dispersed to cover or fill the area below the display area of the pixels of transparent OLED display panel 220. Because the black pigments in the microcapsules are behind the display area, the clear section of each pixel of transparent OLED display panel 220 appears transparent. To move or disperse the microcapsules to the display area a negative electric field or charge may be applied to top transparent electrode conductive substrate 215 or sections thereof. When the negative electric field or charge is applied, the microcapsules with the negatively charged black pigments may be repelled and move or disperse to sections below display areas of the pixels of transparent OLED display panel 220. When the microcapsules are located below the display layers, nothing is blocking the light coming through the clear sections of the pixels which allow the light to pass through restoring transparency of transparent OLED display panel 220. Perspective view 375 and side view 385 further shows diagonal and side views respectively of the micro-capsules below the display area allowing the light to pass through the clear sections of the pixels. In addition, perspective view 375 and side view 385 shows how the sealant occupies the space in the electronic ink layer 230 that is below the clear section of each pixel.

Figure 4:
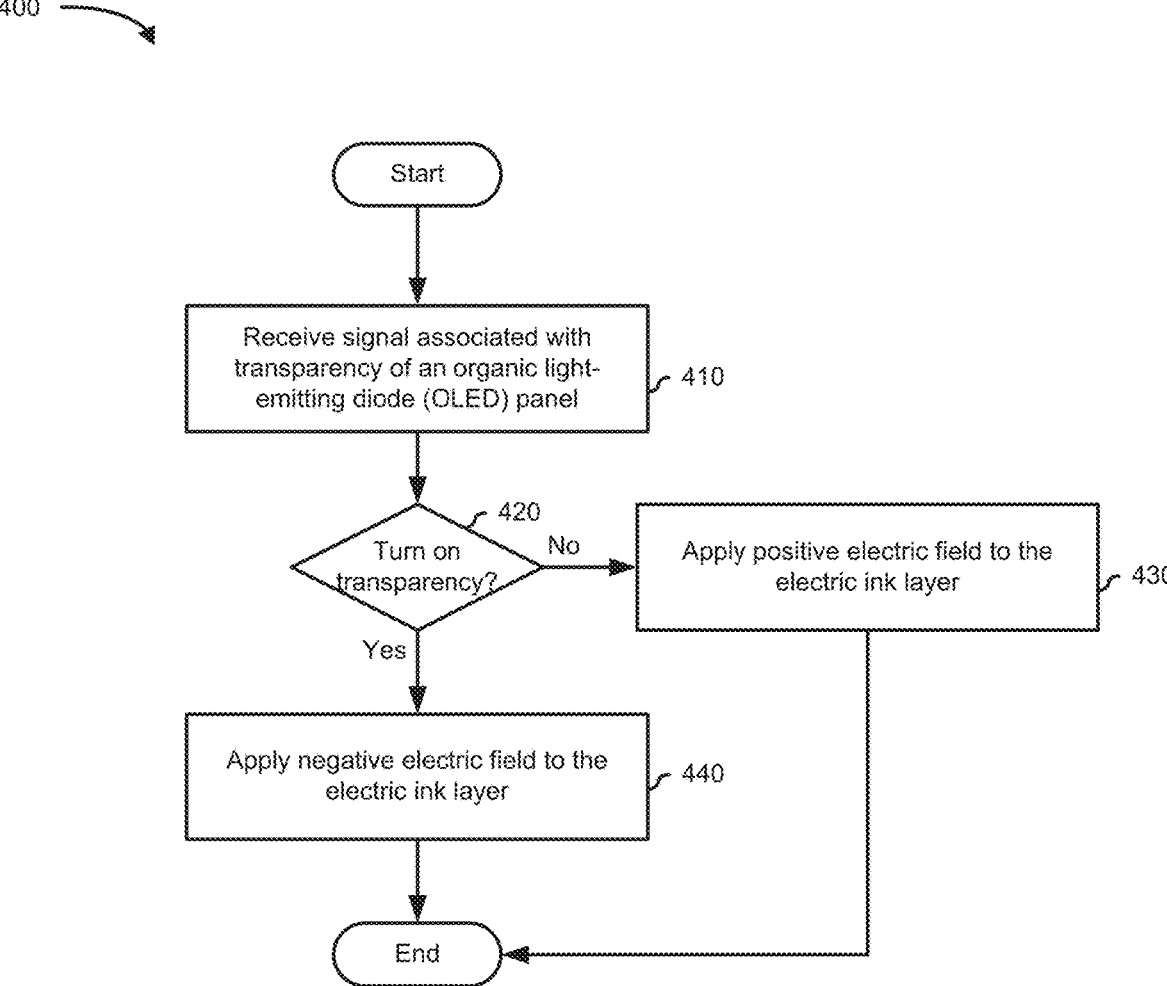
FIG. 4 is a flowchart illustrating an example of a method for switching the transparent effect of a switchable transparent OLED display with the integrated electronic ink layer, according to an embodiment of the present disclosure.

FIG. 4 shows a flow chart of a method 400 for switchable transparent OLED display with the integrated electronic ink layer. Method 400 may be performed by one or more components of display 200 such as OLED display controller 240 of FIG. While embodiments of the present disclosure are described in terms of display 200 of FIG. 2, it should be recognized that other systems may be utilized to perform the described method. One of skill in the art will appreciate that this flowchart explains a typical example, which can be extended to advanced applications or services in practice.

Method 400 typically starts at block 410 where the method receives a signal associated with the transparency state of the transparent OLED display panel. The signal received may be used to turn on or turn off the transparency feature of the transparent OLED display panel. For example, the signal may be received from a user via an interface associated with a display device that includes the transparent OLED display panel such as a television or a display monitor. The signal may also be received from a timing controller associated with the transparent OLED display panel. At block 420, the method determines whether the signal is to switch or turn on or to turn off the transparency effect of the transparent OLED display panel. If the signal is to turn on the transparency state of the transparent OLED display panel, then the "YES" branch is taken and the method proceeds to block 440. If the signal is not to turn on the transparency state of the transparent OLED display panel, then the "NO" branch is taken and the method proceeds to block 430 where a positive electric field is applied to the switching electronic ink layer. The transparent OLED display panel may be switched to an opaque state when the user needs or desires a high contrast such as when watching movies or playing games. In contrast, the transparent OLED display panel may be switched from the opaque state to a transparent state when the user needs or desires transparency such as when the user utilizes the display device as a whiteboard. The electric field may be applied horizontally or vertically by forming a transparent electrode above and below the electronic ink.

Although FIG. 4 shows example blocks of method 400 in some implementation, method 400 may include additional blocks, fewer blocks, different blocks, or differently arranged blocks than those depicted in FIG. 4. Those skilled in the art will understand that the principles presented herein may be implemented in any suitably arranged processing system. Additionally, or alternatively, two or more of the blocks of method 400 may be performed in parallel.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device).

When an element such as a layer, region, or substrate is referred to as "on" or "disposed on" another element, it can be directly on the other element or intervening elements may be present. Accordingly, when the element is referred to as "under" or "disposed under" another element, it can be directly under the other element or intervening elements may be present. Similarly, when an element is referred to as being "connected" to another element, the element may be directed connected to the other element or an intervening element may be present.

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method comprising:
receiving, by a processor, a signal from a timing controller, wherein the signal is associated with a transparency feature of a transparent organic light-emitting diode (OLED) display panel;
determining whether the signal from the timing controller is to turn off the transparency feature of the transparent OLED display panel;
in response to determining that the signal is to turn off the transparency feature of the transparent OLED display panel, applying a positive electric field to an electronic ink layer integrated with the transparent OLED display panel; and
in response to the applying of the positive electric field to the electronic ink layer, dispersing microcapsules laterally to fill spaces below clear sections of pixels of the transparent OLED display panel blocking light coming through the clear sections of the pixels, whereby the transparent OLED display panel transitions to an opaque state, wherein the pixels of the transparent OLED display panel includes red, green, and blue sub-pixels in addition to the clear sections.

2. The method of claim 1, wherein the microcapsules include negatively charged black pigments.

3. The method of claim 1, wherein the electronic ink layer is transparent.

4. The method of claim 2, wherein a sealant fills spaces of the electronic ink layer below display areas of the pixels of the transparent OLED display panel when the negatively charged black pigments dispersed to fill the spaces below the clear sections of the pixels of the transparent OLED display panel.

5. The method of claim 1, further comprising:
in response to determining that the signal is to turn on the transparency feature of the transparent OLED display panel, apply a negative electric field to the electronic ink layer.

6. The method of claim 5, further comprising:
in response to the applying of the negative electric field to the electronic ink layer, microcapsules with negatively charged black pigments disperse to fill spaces below display areas of the pixels of the transparent OLED display panel, whereby the transparent OLED display panel transitions to a transparent state.

7. The method of claim 6, wherein a sealant fills the spaces of the electronic ink layer below the clear sections of the pixels of the transparent OLED display panel when the negatively charged black pigments are dispersed to fill the spaces below the display areas of the pixels of the transparent OLED display panel.

8. An information handling system, comprising:
a transparent organic light-emitting diode (OLED) display panel;
an electronic ink layer integrated with the OLED display panel;
an OLED display controller to control a transparency feature of the OLED display panel, the OLED display controller configured to:
receive a signal from a timing controller, wherein the signal is associated with the transparency feature of the OLED display panel;
in response to a determination that the signal from the timing controller is to turn off the transparency feature of the transparent OLED display panel, apply a positive electric field to the electronic ink layer; and
in response to an application of the positive electric field to the electronic ink layer, disperse microcapsules laterally to fill clear sections of pixels of the transparent OLED display panel blocking, by the microcapsules, light coming through the clear sections of the pixels, whereby the transparent OLED display panel transitions to an opaque state, wherein the pixels of the transparent OLED display panel includes red, green, and blue sub-pixels in addition to the clear sections.

9. The information handling system of claim 8, wherein the electronic ink layer includes a top transparent electrode conductive substrate and a bottom transparent electrode conductive substrate.

10. The information handling system of claim 9, wherein the microcapsules are sandwiched between the top transparent electrode conductive substrate and the bottom transparent electrode conductive substrate.

11. The information handling system of claim 8, wherein the microcapsules are suspended in a clear sealant.

12. The information handling system of claim 8, wherein the OLED display controller is further configured to:
in response to another determination that the signal is to turn on the transparency feature of the transparent OLED display panel, apply a negative electric field to the electronic ink layer.

13. The information handling system of claim 12, wherein the OLED display controller is further configured to:
in response to the application of the negative electric field to the electronic ink layer, the microcapsules with negatively charged black pigments disperse to fill space below display areas of the pixels of the transparent OLED display panel, whereby the transparent OLED display panel transitions to a transparent state.

14. A method comprising:
receiving, by a processor, a signal from a timing controller, wherein the signal is associated with a transparency feature of a transparent organic light-emitting diode (OLED) display panel;
if the signal from the timing controller is to turn on the transparency feature of the transparent OLED display panel, then applying a negative electric field to an electronic ink layer integrated with the transparent OLED display panel; and
in response to the applying of the negative electric field to the electronic ink layer, dispersing microcapsules laterally to fill spaces below clear sections of pixels of the transparent OLED display panel blocking, by the microcapsules, light coming through the clear sections of the pixels, whereby the transparent OLED display panel transitions to a transparent state, wherein the pixels of the transparent OLED display panel includes red, green, and blue sub-pixels in addition to the clear sections.

15. The method of claim 14, further comprising:
in response to determining that the signal is to turn off the transparency feature of the transparent OLED display panel, apply a positive electric field to the electronic ink layer.

16. The method of claim 15, further comprising
in response to the applying of the positive electric field to the electronic ink layer, the microcapsules with negatively charged black pigments disperse to fill the spaces below the clear sections of the pixels of the transparent OLED display panel, whereby the transparent OLED display panel transitions to an opaque state.

17. The method of claim 14, wherein the electronic ink layer includes a top transparent electrode conductive substrate and a bottom transparent electrode conductive substrate.

18. The method of claim 17, wherein the microcapsules are sandwiched between the top transparent electrode conductive substrate and the bottom transparent electrode conductive substrate.

19. The method of claim 14, wherein the microcapsules include negatively charged black pigments.

20. The method of claim 19, wherein a sealant fills spaces of the electronic ink layer below display areas of the pixels of the transparent OLED display panel when the negatively charged black pigments are dispersed to fill the spaces below the clear sections of the pixels of the transparent OLED display panel.

\* \* \* \* \*